(12) United States Patent
Motoki et al.

(10) Patent No.: US 9,070,498 B2
(45) Date of Patent: *Jun. 30, 2015

(54) MULTILAYER ELECTRONIC COMPONENT AND METHOD FOR MANUFACTURING THE SAME

(71) Applicant: Murata Manufacturing Co., Ltd., Nagaokakyo-shi, Kyoto-fu (JP)

(72) Inventors: Akihiro Motoki, Fukui (JP); Makoto Ogawa, Fukui (JP); Kenichi Kawasaki, Echizen (JP); Shunsuke Takeuchi, Echizen (JP); Shigeyuki Kuroda, Sabae (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/320,776

(22) Filed: Jul. 1, 2014

(65) Prior Publication Data

US 2014/0312744 A1   Oct. 23, 2014

Related U.S. Application Data

(60) Continuation of application No. 13/439,916, filed on Apr. 5, 2012, now Pat. No. 8,804,303, which is a division of application No. 12/110,484, filed on Apr. 28, 2008, now Pat. No. 8,184,424, which is a continuation of application No. PCT/JP2007/068625, filed on Sep. 26, 2007.

(30) Foreign Application Priority Data

Nov. 15, 2006   (JP) .................................. 2006-308704

(51) Int. Cl.
*H01C 7/00* (2006.01)
*H01G 4/012* (2006.01)
(Continued)

(52) U.S. Cl.
CPC ............... *H01C 7/008* (2013.01); *H01G 4/012* (2013.01); *H01G 4/2325* (2013.01); *H01G 4/30* (2013.01);
(Continued)

(58) Field of Classification Search
CPC ..... H01G 4/005; H01G 4/2325; H01G 4/232; H01G 4/252; H01G 4/008; H01G 4/30; H01G 4/012; H01C 7/008
USPC ............. 361/321.3, 303, 306.3, 306.2, 306.1, 361/308.1
See application file for complete search history.

(56) References Cited

U.S. PATENT DOCUMENTS 7,177,137 B2 *   2/2007   Ritter et al. ................. 361/306.3
7,344,981 B2 *   3/2008   Ritter et al. .................... 438/678
(Continued)

OTHER PUBLICATIONS

Motoki et al.; "Multilayer Electronic Component Including a Counter Diffusion Layer"; U.S. Appl. No. 12/110,484, filed Apr. 28, 2008.

(Continued)

*Primary Examiner* — David M Sinclair
(74) *Attorney, Agent, or Firm* — Keating & Bennett, LLP

(57) ABSTRACT

A method for manufacturing a multilayer electronic component includes the steps of preparing a laminate including a plurality of laminated insulating layers and a plurality of internal electrodes disposed along interfaces between the insulating layers, edges of the internal electrodes being exposed at a predetermined surface of the laminate, and forming an external electrode on the predetermined surface to electrically connect exposed the edges of the internal electrodes. The step of forming an external electrode includes a plating step of forming a continuous plating film by depositing plating deposits on the edges of the internal electrodes exposed at the predetermined surface and by performing plating growth to be connected to each other, and a heat treatment step of performing a heat treatment at an oxygen partial pressure of about 5 ppm or less and at a temperature of about 600° C. or more.

1 Claim, 2 Drawing Sheets

(51) Int. Cl.
*H01G 4/232* (2006.01)
*H01G 4/30* (2006.01)
*B05D 5/12* (2006.01)
*H01F 27/28* (2006.01)
*H01L 41/083* (2006.01)

(52) U.S. Cl.
CPC .............. *B05D 5/12* (2013.01); *H01G 4/308* (2013.01); *H01F 27/2804* (2013.01); *H01L 41/083* (2013.01)

(56) References Cited

U.S. PATENT DOCUMENTS 8,184,424 B2 *  5/2012  Motoki et al. ............. 361/306.3
8,804,303 B2 *  8/2014  Motoki et al. ............. 361/306.3

OTHER PUBLICATIONS

Motoki et al.; "Multilayer Ceramic Electronic Component and Method for Manufacturing the Same"; U.S. Appl. No. 12/356,648, filed Jan. 21, 2009.
Iwanaga et al.; "Monolithic Ceramic Electronic Component and Method for Manufacturing the Same"; U.S. Appl. No. 12/405,370, filed Mar. 17, 2009.
Iwanaga et al.; "Multilayer Ceramic Electronic Component and Method for Producing Same"; U.S. Appl. No. 12/405,372, filed Mar. 17, 2009.
Kayatani et al.; "Multilayer Ceramic Electronic Component and Method for Making the Same"; U.S. Appl. No. 12/469,799, filed May 21, 2009.
Takeuchi et al.; "Multilayer Ceramic Electronic Component and Manufacturing Method Thereof"; U.S. Appl. No. 12/340,570, filed Dec. 19, 2008.
Kobayashi et al.; "Multilayer Ceramic Electronic Component and Method for Making the Same"; U.S. Appl. No. 12/490,471, filed Jun. 24, 2009.
Nishihara et al.; "Laminated Ceramic Electronic Component and Manufacturing Method Thereof"; U.S. Appl. No. 12/617,879, filed Nov. 13, 2009.
Takeuchi et al.; "Multilayer Electronic Component and Method for Manufacturing the Same"; U.S. Appl. No. 12/817,352, filed Jun. 17, 2010.
Saruban et al.; "Laminated Ceramic Electronic Component and Manufactruing Method Therefor"; U.S. Appl. No. 12/821,305, filed Jun. 23, 2010.
Motoki et al.; "Laminated Ceramic Electronic Component and Manufacturing Method Therefor"; U.S. Appl. No. 13/050,977, filed Mar. 18, 2011.
Takeuchi et al.; "Multilayer Ceramic Electronic Component and Manufacturing Method Thereof"; U.S. Appl. No. 13/433,320, filed Mar. 29, 2012.
Motoki et al.; "Multilayer Electronic Component and Method for Manufacturing the Same"; U.S. Appl. No. 13/439,916, filed Apr. 5, 2012.
Motoki et al.; "Multilayer Electronic Component and Method for Manufacturing the Same"; U.S. Appl. No. 14/177,472, filed Feb. 11, 2014.
Sasabayashi et al.; "Monolithic Ceramic Electronic Component"; U.S. Appl. No. 14/160,947, filed Jan. 22, 2014.

* cited by examiner

MULTILAYER ELECTRONIC COMPONENT AND METHOD FOR MANUFACTURING THE SAME

BACKGROUND OF THE INVENTION

1. Field of the Invention

The present invention relates to a multilayer electronic component and a method for manufacturing the same, and more particularly to a multilayer electronic component formed by plating external electrodes directly on external surfaces of a laminate and to a method for manufacturing the multilayer electronic component.

2. Description of the Related Art

As shown in FIG. 4, a multilayer electronic component 101, which is represented by a multilayer ceramic capacitor, generally includes a laminate 105 including a plurality of insulating layers 102 laminated to each other and a plurality of layer-shaped internal electrodes 103 and 104 provided along interfaces between the insulating layers 102. At end surfaces 106 and 107 of the laminate 105, edges of the internal electrodes 103 and 104 are exposed, respectively, and external electrodes 108 and 109 are provided to electrically connect the edges of the internal electrodes 103 and 104, respectively.

When the external electrodes 108 and 109 are formed, in general, paste electrode films 110 are first formed by applying a metal paste containing a metal component and a glass component on the end surfaces 106 and 107 of the laminate 105, followed by firing. Next, on the paste electrode films 110, first plating layers 111 containing Ni or other suitable material as a primary component are formed, and furthermore, on the first plating films, second plating films 112 containing Sn or other suitable material as a primary component are formed. That is, each of the external electrodes 108 and 109 have a three-layer structure including the paste electrode film 110, the first plating film 111, and the second plating film 112.

The external electrodes 108 and 109 must have superior wettability to solder when the multilayer electronic component 101 is mounted on a substrate using solder. At the same time, the external electrode 108 must electrically connect the internal electrodes 103 which are in an electrically insulated state, and the external electrode 109 must electrically connect the internal electrodes 104 which are in an electrically insulated state. The second plating film 112 ensures the solder wettability, and the paste electrode films 110 electrically connect the respective internal electrodes 103 and 104. The first plating film 111 prevents solder leaching during solder bonding.

However, the paste electrode film 110 has a relatively large thickness, such as several tens to several hundreds micrometers. Thus, when the dimensions of this multilayer electronic component 101 are set within a predetermined standard value, an effective volume to ensure an electrostatic capacity must be decreased by an amount corresponding to that required to ensure the volume of the paste electrodes 110. On the other hand, since the thickness of each of the plating films 111 and 112 is approximately several micrometers, if each of the external electrodes 108 and 109 can be only with the first plating film 111 and the second plating film 112, a larger effective volume for the electrostatic capacity can be provided.

For example, Japanese Unexamined Patent Application Publication No. 63-169014 disclose a method for depositing a conductive metal layer by electroless plating so that internal electrodes exposed at one side wall surface of a laminate are short-circuited to the entire side wall surface at which the internal electrodes are exposed.

However, in the method disclosed in Japanese Unexamined Patent Application Publication No. 63-169014, since the bonding between the internal electrodes and the plating film is insufficient, moisture and other contaminants are disadvantageously likely to enter the laminate. Thus, when a loading test is performed under high-temperature and high-humidity conditions, the life of a multilayer electronic component is likely to be reduced.

SUMMARY OF THE INVENTION

To overcome the problems described above, preferred embodiments of the present invention provide a method for manufacturing a multilayer electronic component, and a multilayer electronic component manufactured thereby.

A preferred embodiment of the present invention is directed to a method for manufacturing a multilayer electronic component, including the steps of preparing a laminate which includes a plurality of insulating layers laminated to each other and a plurality of internal electrodes formed along interfaces between the insulating layers, edges of the internal electrodes being exposed at a predetermined surface of the laminate, and forming an external electrode on the predetermined surface so as to electrically connect the edges of the internal electrodes, which are exposed at the predetermined surface of the laminate.

Preferably, the step of forming an external electrode includes the steps of a plating step of forming a continuous plating film by depositing plating deposits on the edges of the internal electrodes exposed at the predetermined surface of the laminate which is prepared in the step of preparing a laminate and by performing plating growth of the plating deposits so as to be connected to each other, and a heat treatment step of performing a heat treatment on the laminate provided with the plating film at an oxygen partial pressure of about 5 ppm or less and at a temperature of about 600° C. or more.

In the above-described heat treatment step, the temperature to be applied is preferably about 800° C. or more.

A metal defining a primary component of the internal electrodes and a metal defining a primary component of the plating film are preferably different from each other.

The metal which is a primary component of the internal electrodes may be, for example, Ni, Cu, Pd, or Ag. In the preferred embodiment described above, for the metal which is a primary component of the internal electrodes and the metal which is a primary component of the plating film, when the former is Ni, the latter is preferably at least one of Ag, Au, Co, Cr, Cu, Fe, Sn, Pt, and Pd; when the former is Cu, the latter is preferably at least one of Ag, Au, Co, Cr, Fe, In, Ir, Ni, Pd, Pt, Rh, Sn, and Zn; when the former is Pd, the latter is preferably at least one of Cu, Fe, Ni, Rh, and Sn; and when the former is Ag, the latter is preferably at least one of Au, Co, Cu, Fe, In, Ni, Pd, Sn, and Zn.

More preferably, the metal which is a primary component of the internal electrodes is Ni, Cu, Pd, or Ag. In the preferred embodiment described above, for the metal which is a primary component of the internal electrodes and the metal which is a primary component of the plating film, when the former is Ni, the latter is Cu; when the former is Cu, the latter is Ni; and when the former is Pd or Ag, the latter is Cu or Ni.

The step of forming an external electrode may further include a step of forming a second plating film on the plating film. The heating treatment step is preferably performed before the step of forming a second plating film.

A multilayer electronic component obtained by the manufacturing method according to preferred embodiments of the present invention has the following structural features.

A multilayer electronic component according to a preferred embodiment of the present invention includes a laminate which includes a plurality of insulating layers laminated to each other and a plurality of internal electrodes provided along interfaces between the insulating layers, edges of the internal electrodes being exposed at a predetermined surface of the laminate, and an external electrode provided on the predetermined surface. The external electrode includes a plating film which is directly provided on the predetermined surface of the laminate so as to electrically connect the edges of the internal electrodes exposed at the predetermined surface of the laminate. In addition, at boundary portions between each of the internal electrodes and the plating film, a counter diffusion layer is provided, in which a metal component in the plating film and a metal component in the internal electrodes are both detectable, so as to extend to both sides of the internal electrodes and the plating film, and at the side of the internal electrodes, the counter diffusion layer extends to a location spaced from the predetermined surface of the laminate by about 2 μm or more.

According to preferred embodiments of the present invention, after the plating film is formed which defines the external electrode, a heat treatment under specific conditions is performed, and counter diffusion occurs at the boundary portions between the internal electrodes and the plating film. This counter diffusion causes volume expansion at locations at which it occurs. That is, at the boundary portions between the internal electrodes and the plating film, volume expansion occurs. As a result, voids which may be generated at individual interfaces of the insulating layers with the internal electrodes and the external electrode are filled, and as a result, sealing properties are provided to the laminate. Thus, moisture, a plating solution, and other contaminants are prevented from entering the laminate, and as a result, a reduction in life, which is caused when a loading test is performed under high-temperature and high-humidity conditions, is prevented.

When the temperature to be applied in the heat treatment step is increased to about 800° C. or more, at the location at which the counter diffusion occurs, uniform dispersion between a plating film component and an internal electrode component is provided. This phenomenon rapidly occurs when the heat treatment temperature reaches about 800° C. or more, and as a result, the above sealing properties are significantly improved.

In addition, when the metal which is a primary component of the internal electrode and the metal which is a primary component of the plating film are different from each other, the counter diffusion is improved as compared to that obtained when the metals are the same.

In a preferred embodiment in which the second plating film is formed on the plating film, which is to be processed by the heat treatment as described above to form the external electrode, when the heat treatment step is performed before the step of forming a second plating film, a plating solution used for forming the second plating film is prevented from entering the laminate.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
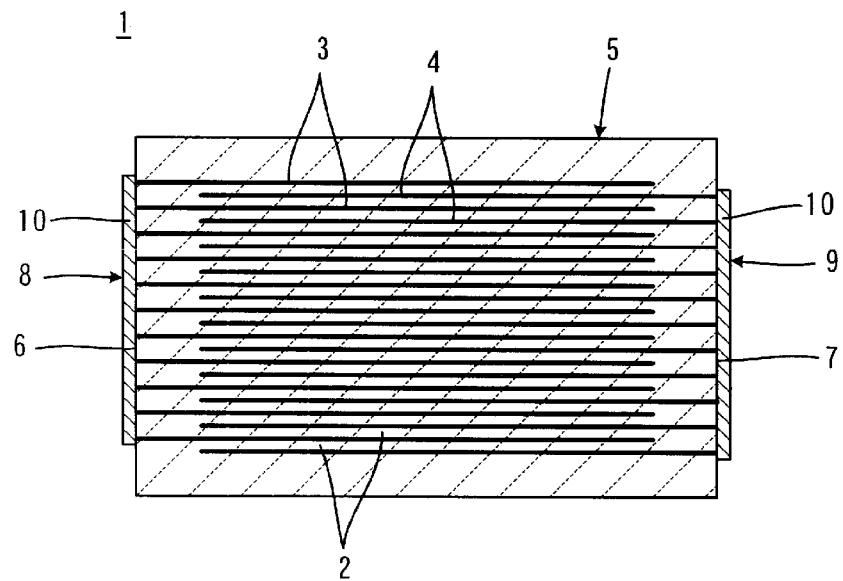
FIG. 1 is a cross-sectional view showing a multilayer electronic component 1 according to a first preferred embodiment of the present invention.
Figure 2:
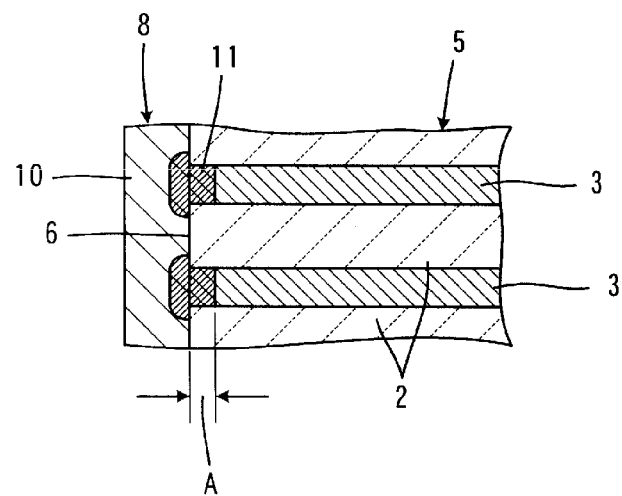
FIG. 2 is a partly enlarged cross-sectional view of a laminate 5 shown in FIG. 1.

With reference to FIGS. 1 and 2, a multilayer electronic component 1 according to a first preferred embodiment of the present invention and a method for manufacturing the same will be described.

First, as shown in FIG. 1, the multilayer electronic component 1 includes a laminate 5 which includes a plurality of insulating layers 2 laminated to each other and layer-shaped internal electrodes 3 and 4 provided along interfaces between the insulating layers 2. When the multilayer electronic component 1 is a multilayer ceramic capacitor, the insulating layers 2 are made of a dielectric ceramic. At end surfaces 6 and 7 of the laminate 5, edges of a plurality of internal electrodes 3 and 4 are exposed, respectively, and external electrodes 8 and 9 are provided so as to electrically connect the edges of the internal electrodes 3 and the edges of the internal electrodes 4, respectively.

Each of the external electrodes 8 and 9 are defined by a plating film 10 of plating deposits formed by wet plating, such as electroplating or electroless plating. That is, the external electrodes 8 and 9 do not include a conductive paste film, a vacuum deposition film, a sputtering film, or other films.

Next, the method for manufacturing the multilayer electronic component 1 will be described with reference to FIG. 2. A method for forming the external electrodes 8 and 9 will primarily be described. FIG. 2 shows a portion of the laminate 5 shown in FIG. 1 and is an enlarged view in the vicinity of the one end surface 6 at which the internal electrodes 3 are exposed. In addition, the other end surface 7 and the internal electrodes 4 exposed at the other end surface 7 are substantially the same as the end surface 6 and internal electrodes 3.

First, the laminate 5 is prepared which includes the insulating layers 2 laminated to each other and the internal electrodes 3 and 4 formed along the interfaces between the insulating layers 2, and the edges of the internal electrodes 3 and 4 are exposed at the end surfaces 6 and 7, respectively. In this laminate 5, when the internal electrodes 3 and 4 are recessed from the end surfaces 6 and 7 and are not sufficiently exposed, the insulating layers 2 are preferably ground by a method, such as sandblasting or barrel polishing, so as to sufficiently expose the internal electrodes 3 and 4 at the end surfaces 6 and 7, respectively.

Next, a step of forming the external electrodes 8 and 9 is performed on the end surfaces 6 and 7 of the laminate 5 so as to electrically connect the edges of the internal electrodes 3 and 4 exposed at the end surfaces 6 and 7 of the laminate 5, respectively.

In the step of forming the external electrodes 8 and 9, a plating step is performed in which plating deposits are first deposited on the edges of the internal electrodes 3 and 4, which are exposed at the end surfaces 6 and 7 of the laminate 5, and are then processed by plating growth to be connected to each other so that continuous plating films 10 are directly formed on the end surfaces 6 and 7.

Next, the laminate 5 provided with the plating films 10 is heat-treated at an oxygen partial pressure of about 5 ppm or less and at a temperature of about 600° C. or more. This heat treatment causes counter diffusion between a metal component in the internal electrodes 3 and 4 and a metal component in the plating films 10 forming the external electrodes 8 and 9. As a result, as shown in FIG. 2, at each of boundary portions between the internal electrodes 3 and 4 and the plating films 10, a counter diffusion layer 11 is formed. Due to the counter diffusion, volume expansion occurs at the boundary portions between the internal electrodes 3 and 4 and the plating films 10, and voids at interfaces between the insulating layers 2 and the internal electrodes 3 and 4 and voids at interfaces between the insulating layers 2 and the plating films 10 are filled. Thus, moisture, a plating solution, and other contaminants are prevented from entering the laminate 5, and as a result, the life properties obtained when a loading test is performed under high-temperature and high-humidity conditions are prevented from deteriorating.

As the counter diffusion layer 11, the condition in which the metal component in the plating films 10 and the metal component in the internal electrodes 3 and 4 are both detectable must be satisfied. In other words, the region in which the above-described condition is satisfied is defined as the counter diffusion layer 11.

The counter diffusion layers 11 are formed, as shown in FIG. 2, so as to extend to both sides of the internal electrodes 3 and 4 and the plating films 10. In order to obtain sufficient sealing properties, the counter diffusion layer 11 must be formed in a region having at least predetermined dimensions. As a rough indication, when the areas of the counter diffusion layers 11 formed at the internal electrodes 3 and 4 sides extends to locations spaced from the respective end surfaces 6 and 7 by a distance A as shown in FIG. 2, and when the distance A is about 2 μm or more, it has been found from the below-described experimental example that a sufficient sealing effect is obtained.

The temperature to be applied in the above-described heat treatment step is preferably increased to about 800° C. or more. By this temperature, at the location at which the counter diffusion occurs, the uniform dispersion between the plating film component and the internal electrode component is significantly improved. This phenomenon is rapidly achieved when the heat treatment temperature is about 800° C. or more, and the above sealing properties are significantly improved.

In addition, the upper limit of the temperature to be applied in the heat treatment step is not particularly limited. However, a temperature at which the insulating layers 2 are not deteriorated and at which the metals in the internal electrodes 3 and 4 and the plating films 10 are not melted may be regarded as the upper limit.

In order to enable the counter diffusion to easily occur by the heat treatment, the metal which is a primary component of the internal electrodes 3 and 4 and the metal which is a primary component of the plating film 10 are preferably different from each other.

As the metal which is a primary component of the internal electrodes 3 and 4, for example, Ni, Cu, Pd, or Ag is used. In the case described above, for the metal which is a primary component of the internal electrodes 3 and 4 and the metal which is a primary component of the plating film 10, when the former is Ni, the latter is preferably at least one of Ag, Au, Co, Cr, Cu, Fe, Sn, Pt, and Pd; when the former is Cu, the latter is preferably at least one of Ag, Au, Co, Cr, Fe, In, Ir, Ni, Pd, Pt, Rh, Sn, and Zn; when the former is Pd, the latter is preferably at least one of Cu, Fe, Ni, Rh, and Sn; and when the former is Ag, the latter is preferably at least one of Au, Co, Cu, Fe, In, Ni, Pd, Sn, and Zn.

More preferably, as the metal which is a primary component of the internal electrodes 3 and 4, Ni, Cu, Pd, or Ag is used. In the case described above, for the metal which is a primary component of the internal electrodes 3 and 4 and the metal which is a primary component of the plating film 10, when the former is Ni, the latter is Cu; when the former is Cu, the latter is Ni; and when the former is Pd or Ag, the latter is Cu or Ni.

The presence of the counter diffusion layer 11 as shown in FIG. 2 can be confirmed, for example, by performing a mapping analysis using a wavelength dispersive x-ray microanalyzer (WDX). That is, with a mapping analysis using WDX, a two-dimensional diffusion state of metal elements can be determined.

In the multilayer electronic component 1 as described above, each of the external electrodes 8 and 9 is formed of a single-layer plating film 10. However, at least one layer may be further formed as a plating film. One example of a multilayer electronic component in which each of the external electrodes is formed of a plurality of plating films will be described with reference to FIG. 3.

Figure 3:
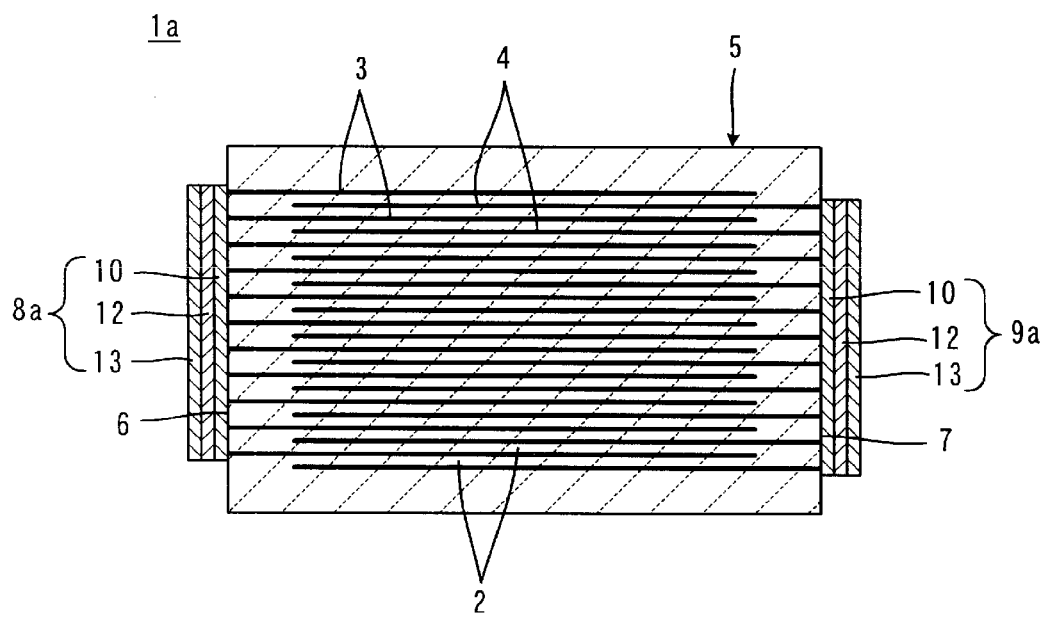
FIG. 3 is a cross-sectional view of a multilayer electronic component 1a according to a second preferred embodiment of the present invention.
Figure 4:
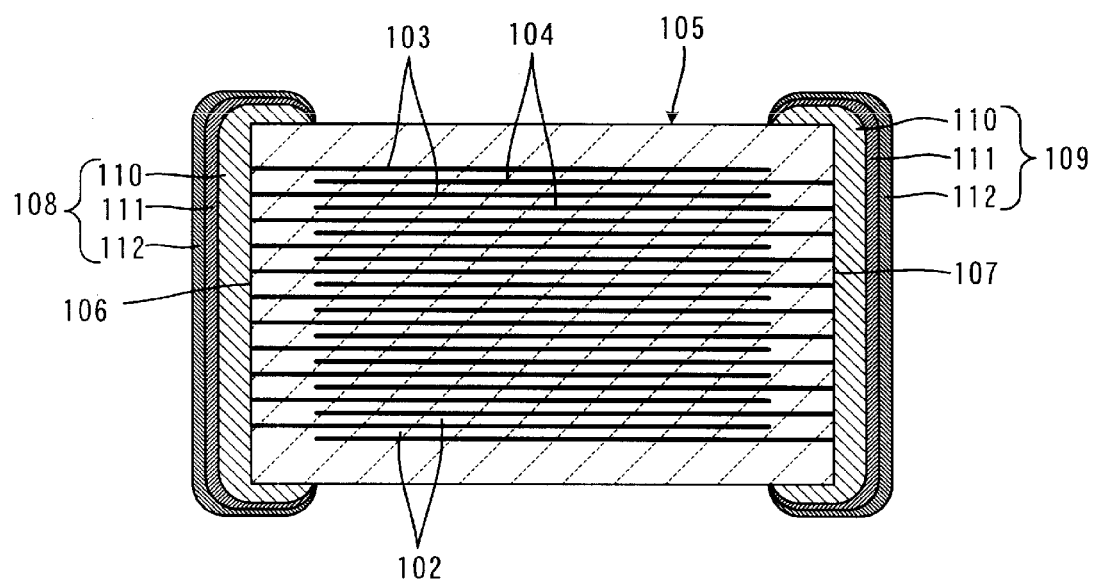
FIG. 4 is a cross-sectional view of a conventional multilayer electronic component 101.

FIG. 3 shows a multilayer electronic component 1a according to a second preferred embodiment of the present invention and corresponds to FIG. 1. In FIG. 3, elements corresponding to the elements shown in FIG. 1 are designated by the same reference numerals, and descriptions thereof are omitted.

In the external electrodes 8a and 9a of the multilayer electronic component 1a, each the plating films 10 formed on the end surfaces 6 and 7 of the laminate 5 define an underlying layer, and an intermediate plating film 12 as a second plating film, and an exterior plating film 13 are formed by electroplating or electroless plating in a similar manner to the plating film 10.

Since the exterior plating film 13 must have superior wettability to solder, for example, Sn or Au is preferably used as a primary component. In this preferred embodiment, the plating film 10 defining an underlying layer includes, for example, Cu as a primary component. Since the intermediate plating film 12 must prevent solder leaching during solder bonding, for example, Ni is preferably used as a primary component. In addition, when the plating film 10 defining an underlying layer includes Ni as a primary component, the intermediate plating film 12 may be omitted.

As shown in FIG. 3, even when each of the external electrodes 8a and 9a are formed of a plurality of layers, that is, the plating films 10, 12, and 13, the film in which the counter diffusion occurs is primarily the plating film 10 defining an underlying layer. The heat treatment causing the counter diffusion as described above may be performed at any time after the plating film 10 is formed. However, it is preferably performed before the steps of forming the intermediate plating film 12 and the exterior plating film 13 are performed. The reason for this is that due to the heat treatment, intrusion of plating solutions used for forming the intermediate plating film 12 and the exterior plating film 13 is advantageously prevented.

Heretofore, the present invention has been described with reference to the preferred embodiments shown in the figures. However, without departing from the spirit and the scope of the present invention, various changes and modifications may be made.

For example, as the multilayer electronic component to which the present invention may be applied, for example, a multilayer ceramic capacitor has been described. However, in addition to a multilayer ceramic capacitor, the present invention may also be applied to a multilayer chip inductor, a multilayer chip thermistor, and other suitable multilayer component.

Accordingly, since the insulating layer provided in the multilayer electronic component is only required to have an electrical insulating function, a material used for the insulating layer is not particularly limited. That is, instead of a dielectric ceramic insulating layer, an insulating layer made of a piezoelectric ceramic, a semiconductor ceramic, a magnetic ceramic, or other suitable insulating material may also be used.

Hereinafter, the following experimental examples performed to determine the range of the present invention and to confirm the effects of the present invention will be described.

A laminate for a multilayer ceramic capacitor was prepared having a length of about 1.9 mm, a width of about 1.05 mm, and a height of about 1.05 mm, in which insulating layers were made of a barium titanate dielectric ceramic, and internal electrodes were primarily made of Ni. In this laminate, the number of insulating layers thus laminated was 416, and the thickness of each insulating layer was about 1.9 μm.

Next, the above-described laminate was charged in a horizontal rotating barrel, and conductive media having a diameter of about 1.8 mm were also charged therein. Subsequently, the rotating barrel was immersed in a Cu plating strike bath having a controlled pH of about 8.5 and a bath temperature of about 25° C., and while the barrel was being rotated at a rotation rate of about 10 rpm, Cu plating films were directly formed on the end surfaces of the laminate at which the internal electrodes were exposed at a current density of about 0.11 A/dm$^2$ for about 60 minutes. In addition, the Cu plating strike bath contained about 14 g/L of copper pyrophosphate, about 120 g/L of pyrophosphoric acid, and about 10 g/L of potassium oxalate.

Next, a rotating barrel containing the laminate provided with the Cu plating films thereon was immersed in a pyrophosphoric acid bath for Cu plating (Pyrobright process manufactured by C Uyemura & Co., Ltd.), having a controlled pH of about 8.8 and a bath temperature of about 55° C., and while the barrel was being rotated at a rotation rate of about 10 rpm, electroplating was performed at a current density of about 0.30 A/dm$^2$ for about 60 minutes. As described above, on the Cu plating film, a Cu plating film was formed, so that the total thickness of the Cu plating film was approximately about 10 μm.

Next, the laminate provided with the Cu plating films formed thereon was heat-treated for about 2 hours in a nitrogen atmosphere having an oxygen partial pressure of about 5 ppm or less and at a temperature shown in the column "Heat Treatment Temperature" in Table 1. In addition, sample 4 was not heat-treated.

Subsequently, in order to confirm the conditions of the counter diffusion, which was generated by the heat treatment, at the boundary portions between the internal electrodes and the Cu plating film, a mapping analysis using WDX was performed for each sample, and a two-dimensional diffusion state of metal elements was analyzed. In this analysis, as an apparatus, JXA8500F manufactured by JEOL Ltd. was used, the accelerating voltage was set to about 15 kV, the irradiation current was set to about 50 nA, the magnification of a scanning electron microscope (SEM) was set to about 5,000 times, the cumulative time was set to about 40 ms, and as the detection characteristic x-ray of Ni and Cu, a primary ray of Kα characteristic x-ray was used. The conditions of the counter diffusion obtained as described above are shown in "Counter Diffusion Layer Formation Distance" in Table 1. This "Counter Diffusion Layer Formation Distance" corresponds to "A" shown in FIG. 2.

Next, the laminate was charged in a horizontal rotating barrel, and conductive media having a diameter of about 1.8 mm were also charged therein. Subsequently, the rotating barrel was immersed in a Ni plating Watt bath having a controlled pH of about 4.2 and a bath temperature of about 60° C., and while the barrel was being rotated at a rotation rate of about 10 rpm, electroplating was performed at a current density of about 0.20 A/dm$^2$ for about 60 minutes. As described above, on the above Cu plating film, a Ni plating film having a thickness of approximately 4 μm was formed.

Subsequently, a rotating barrel in which the laminate provided with the Ni plating films formed thereon was received was immersed in a Sn plating bath (Sn-235 manufactured by Dipsol Chemicals Co., Ltd.) having a controlled pH of about 5.0 and a bath temperature of about 33° C., and while the barrel was being rotated at a rotation rate of about 10 rpm, electroplating was performed at a current density of about 0.10 A/dm$^2$ for about 60 minutes. As described above, on the above Ni plating film, a Sn plating film having a thickness of approximately 4 μm was formed.

Accordingly, a multilayer electronic component of each sample was obtained in which the electroplating films were formed directly on the laminate as the external electrodes.

As a high-temperature and high-humidity loading test, a PCBT (Pressure Cooker Bias Test) was performed on the multilayer electronic component of each sample. As the test conditions, the temperature was set to about 125° C., the humidity was set to about 95%, the voltage was set to about 6.3 V, the time was set to about 72 hours, and a multilayer electronic component having a resistance of about 1 MΩ or less was determined to be a defect, so that the defective fraction was calculated. The results are shown in the column "PCBT Defective Fraction (1)" in Table 1.

In addition, a PCBT test under severer test conditions was further performed on the multilayer electronic component of each sample. As the test conditions, the temperature was set to about 150° C., the humidity was set to about 95%, the voltage was set to about 6.3 V, and the time was set to about 144 hours. Also in this PCBT test, a multilayer electronic component having a resistance of about 1 MΩ or less was determined to be a defect, and the defective fraction was calculated. The results are shown in the column "PCBT Defective Fraction (2)" in Table 1.

TABLE 1

| Sample No. | Heat Treatment Temperature | Counter Diffusion Layer Formation Distance | PCBT Defective Fraction (1) | PCBT Defective Fraction (2) |
| --- | --- | --- | --- | --- |
| 1 | 900° C. | 50 μm | 0% | 0% |
| 2 | 800° C. | 30 μm | 0% | 0% |
| 3 | 600° C. | 2 μm | 0% | 30% |
| 4 | — | 0 | 100% | 100% |
| 5 | 400° C. | 0.4 μm | 80% | 100% |

From Table 1, it was discovered that by performing the heat treatment, the counter diffusion layer is formed. In addition, it was also discovered that the formation of the counter diffusion layer has an influence on the PCBT defective fraction.

Particularly, when the heat treatment temperature is set to about 600° C. or more as the cases of samples 1 to 3, the "PCBT Defective Fraction (1)" can be decreased to 0%. In addition, as in samples 1 and 2, when the heat treatment temperature is set to about 800° C. or more, the sealing properties are further improved as described above, and as a result, the defective fraction under the severer test conditions, that is, the "PCBT Defective Fraction (2)", are also decreased to 0%.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer electronic component comprising:
a laminate including a plurality of insulating layers laminated to each other and a plurality of internal electrodes provided along interfaces between the insulating layers, edges of the internal electrodes being exposed at a predetermined surface of the laminate; and
an external electrode provided on the predetermined surface; wherein
the external electrode includes a plurality of plated films including a plated film which is directly provided on the predetermined surface of the laminate so as to electrically connect the edges of the internal electrodes exposed at the predetermined surface of the laminate;
at a boundary portion between each of the internal electrodes and the plated film provided on the predetermined surface of the laminate among the plurality of the plated films, a counter diffusion layer is provided, in which a metal material in the plated film is diffused into the internal electrodes and a metal material in the internal electrodes is diffused into the plated film such that the metal material in the plated film and the metal material in the internal electrodes are both detectable in the counter diffusion layer, and extend to both sides of the internal electrodes and the plated film, and, at a side of the internal electrodes, the counter diffusion layer extends to a location spaced from the predetermined surface of the laminate by about 2 μm or more; and
the metal material in the plated film is different from the metal material in the internal electrodes.

* * * * *